United States Patent
Utsunomiya et al.

[11] Patent Number: 5,933,043
[45] Date of Patent: Aug. 3, 1999

[54] HIGH SPEED LEVEL SHIFT CIRCUIT

[75] Inventors: Takanori Utsunomiya; Hidehiko Tachibana, both of Oita, Japan

[73] Assignee: Kabushiki Kaisha Toshiba, Kawasaki, Japan

[21] Appl. No.: 08/955,456

[22] Filed: Oct. 21, 1997

[30] Foreign Application Priority Data

Oct. 22, 1996 [JP] Japan .................................. 8-279269

[51] Int. Cl.$^6$ ........................................................ H03L 5/00
[52] U.S. Cl. .............................. 327/333; 327/52; 327/55; 327/541; 326/63; 326/80
[58] Field of Search .................................... 327/333, 108, 327/436, 541, 51, 52, 54, 55; 326/63, 68, 80, 81, 83

[56] References Cited

U.S. PATENT DOCUMENTS

| | | | |
|---|---|---|---|
| 4,601,017 | 7/1986 | Mochizuki et al. | 365/189 |
| 4,654,547 | 3/1987 | Shaver | 326/113 |
| 4,695,744 | 9/1987 | Giordano | 327/333 |
| 4,703,199 | 10/1987 | Ely | 327/333 |
| 4,996,443 | 2/1991 | Tateno | 326/68 |
| 5,325,001 | 6/1994 | Brunolli | 327/54 |
| 5,378,932 | 1/1995 | Shin et al. | 327/333 |
| 5,430,335 | 7/1995 | Tanoi | 327/170 |
| 5,461,333 | 10/1995 | Condon et al. | 327/208 |
| 5,493,245 | 2/1996 | Kao et al. | 327/333 |
| 5,587,676 | 12/1996 | Chowdhury | 327/108 |
| 5,675,278 | 10/1997 | Tanaka et al. | 327/333 |
| 5,723,986 | 3/1998 | Nakashiro et al. | 326/81 |

*Primary Examiner*—Timothy P. Callahan
*Assistant Examiner*—An T. Luu
*Attorney, Agent, or Firm*—Foley & Lardner

[57] ABSTRACT

In a level shift circuit having a bias circuit and an output circuit, the current consumption of the bias circuit can be suppressed, and further the delay of the output signal relative to the input signal can be reduced. The ratio circuit comprises a bias circuit block (5) composed of a transistor (1) connected to a high potential power source (7) and having a gate to which an input bias INBIAS is applied through a bias input terminal (11), a transistor (2) connected in series to the transistor (1) so as to function as a resistance, and a transistor (13) connected in series to the transistor (2) and a low potential power source (8); and an output circuit block (6) composed of a transistor (3) connected to the high potential power source (7) and having a gate to which an input signal IN is applied through an input terminal (10) and a drain from which an output signal OUT is derived to an output terminal (12), and a transistor (4) connected in series to the transistor (3) and a low potential power source (8). Further, a voltage VBIAS1 is applied from the drain of the transistor (1) to the gate of the transistor (4), and further a switching signal is applied from the drain of the transistor (3) to the gate of the transistor (13).

7 Claims, 10 Drawing Sheets

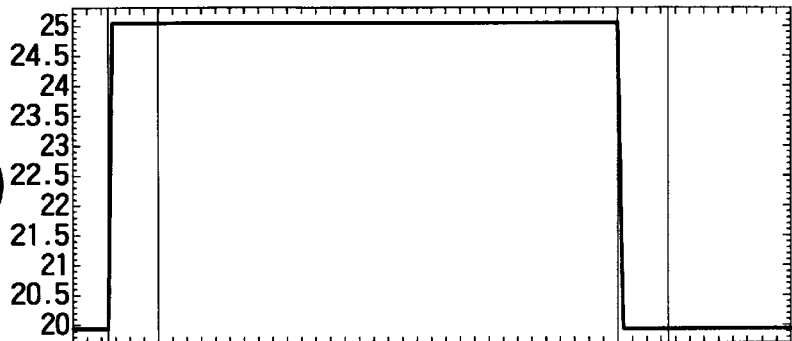
FIG.2(A) VIN
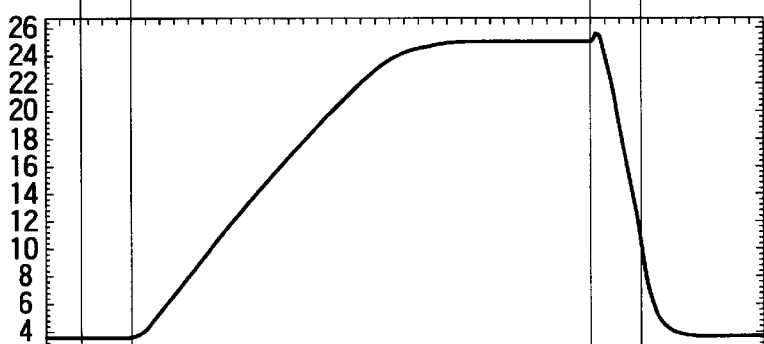
FIG.2(B) OUT
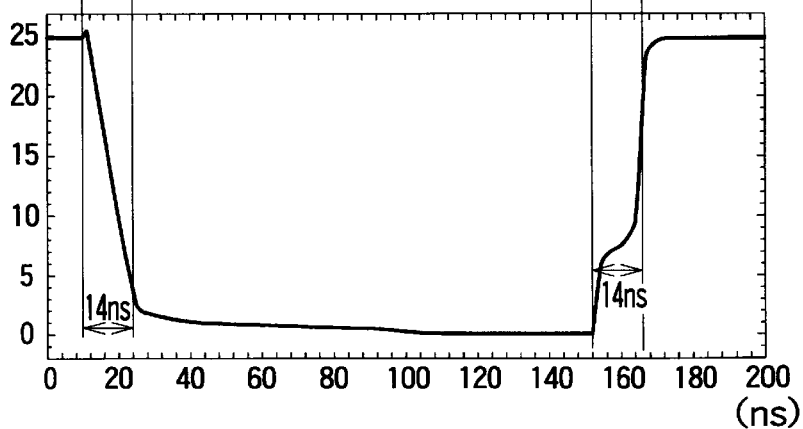
FIG.2(C) VBIAS1

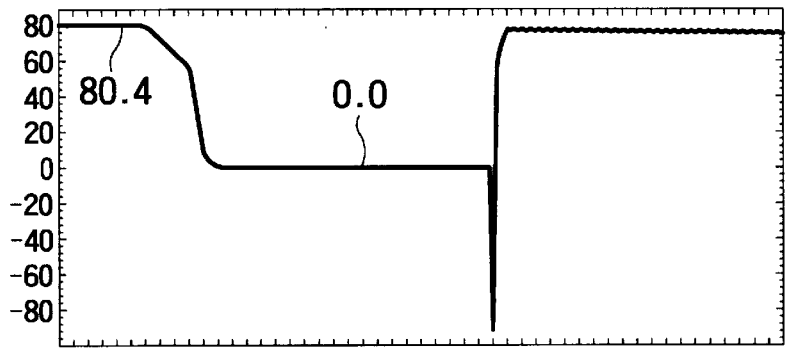
FIG.3(A) IB1
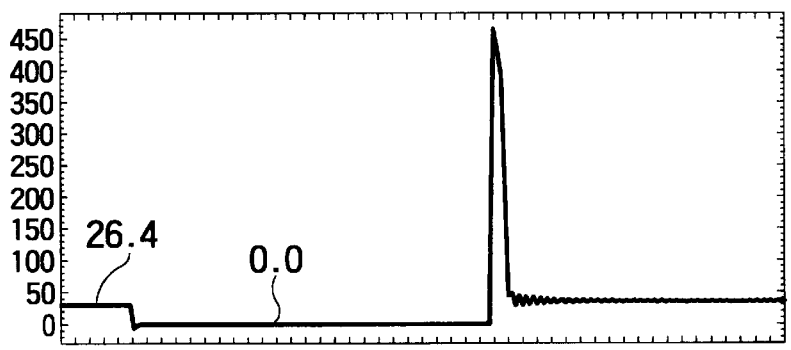
FIG.3(B) IO1
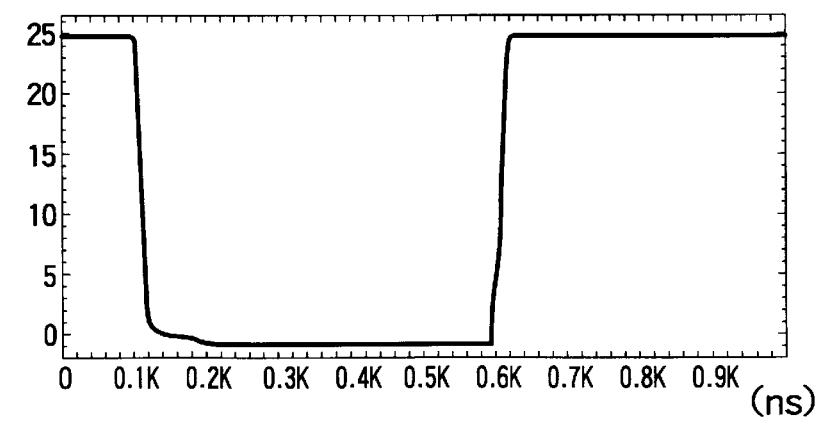
FIG.3(C) OUT

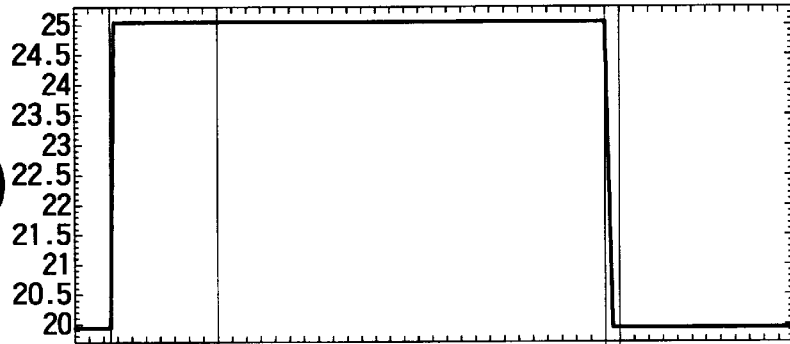
FIG.7(A) PRIOR ART — VIN
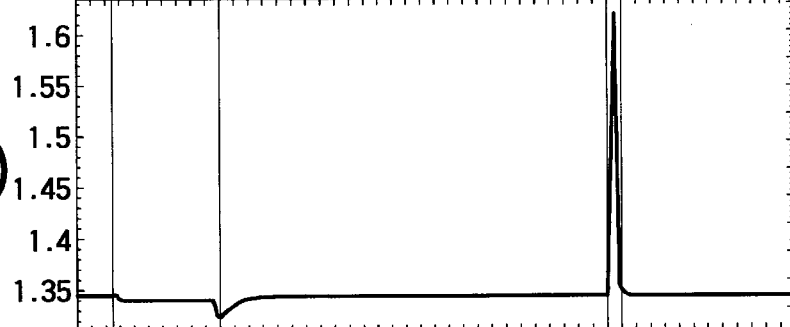
FIG.7(B) PRIOR ART — OUT
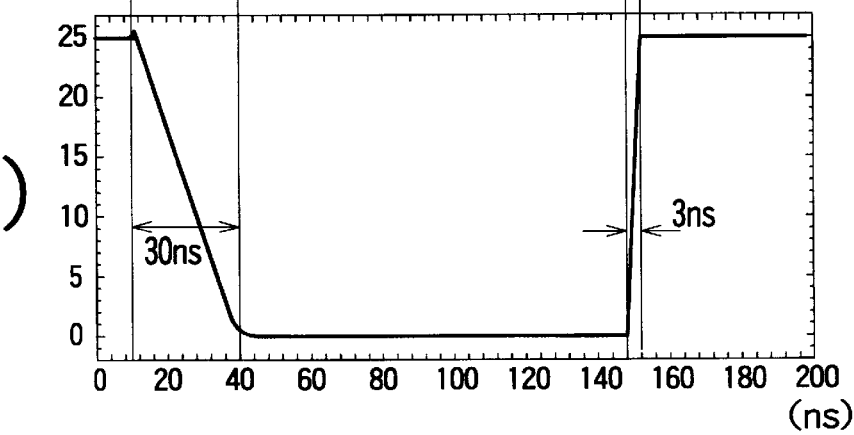
FIG.7(C) PRIOR ART — VBIAS1

IB1

IO1

OUT

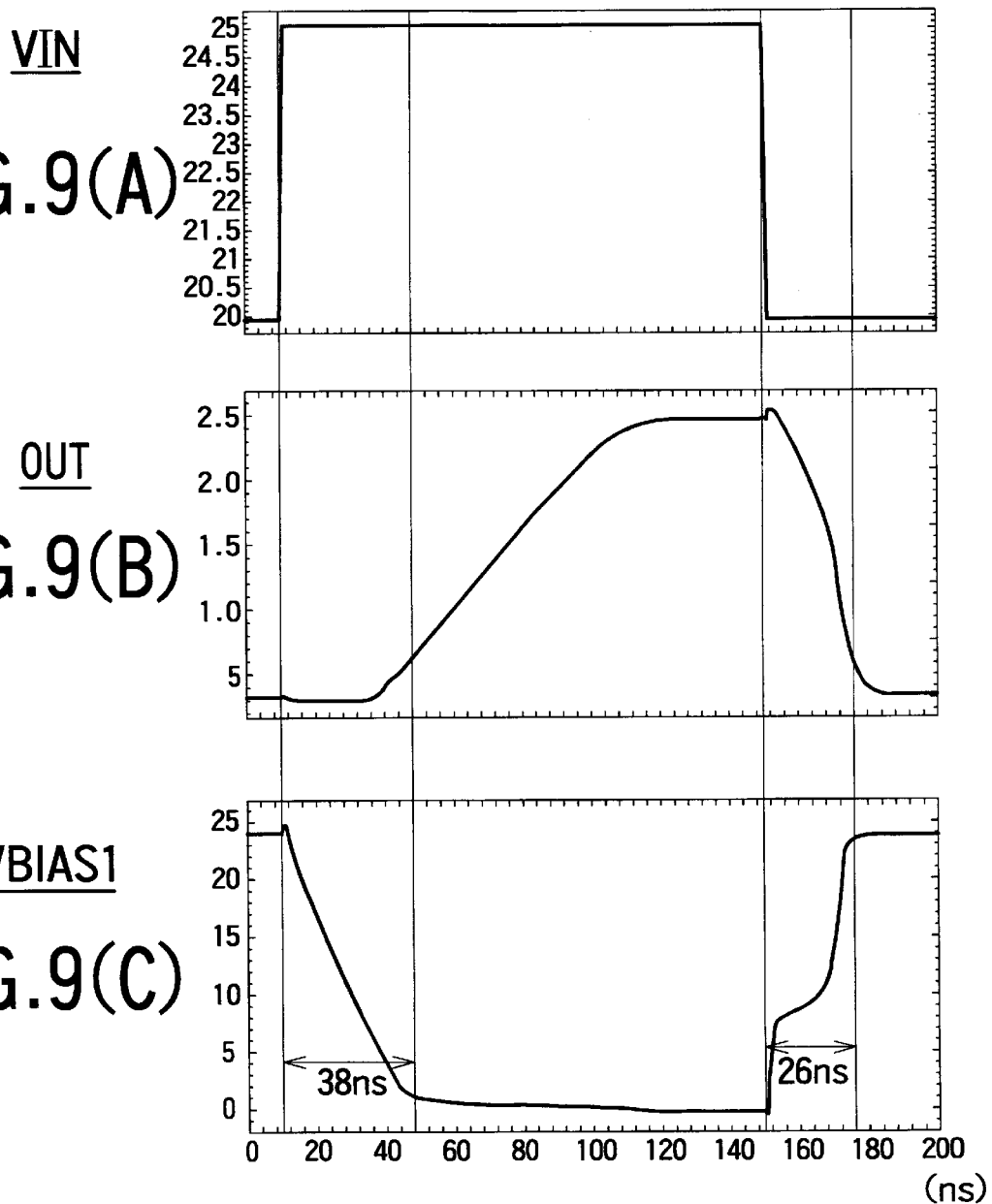

IB1

IO1

OUT

HIGH SPEED LEVEL SHIFT CIRCUIT

BACKGROUND OF THE INVENTION

1. Field of the Invention

The present invention relates to a semiconductor circuit device, and more specifically to a semiconductor circuit device suitable for use as a ratio circuit (level shift circuit) composed of CMOS circuits to transmit signals from small potential difference logic circuits to large potential difference logic circuits in an integrated circuit.

2. Related Art

Conventionally, in a ratio circuit used in a CMOS integrated circuit, the output level of the ratio circuit is generally controlled on the basis of a change in the small input level, by use of a constant current generating circuit and a transistor switched on the basis of change of the input signal level.

FIG. 6 is a circuit diagram showing a known semiconductor circuit device.

As shown in FIG. 6, the ratio circuit is composed of a bias circuit block 5 and an output circuit block 6 connected in series to each other.

The bias circuit block 5 has a CMOS structure obtained by connecting a P-channel transistor 1 and an N-channel transistor 2 in series to each other, in which two drains of the two transistors 1 and 2 are connected in common and derived to a node 9.

Further, a voltage VDD is supplied from a high potential power source 7 to a source of the transistor 1.

Also, the gate of the transistor 2 is connected to a drain thereof, and a voltage GND of a low potential power source 8 is connected to a source of the transistor 2.

An input bias INBIAS is applied to a bias input terminal 11.

The output circuit block 6 has a CMOS structure obtained by connecting a P-channel transistor 3 and an N-channel transistor 4 in series to each other, in which two drains of the two transistors 3 and 4 are connected in common as an output terminal 12 and derived to an output terminal 12.

Further, the voltage VDD is supplied from the high potential power source 7 to a source of the transistor 3, and an input terminal 10 is connected to a gate of the same transistor 3.

Also a voltage GND of the low potential power source 8 is connected to a source of the transistor 4, and the node 9 derived from the common-connected drains of the two transistors 1 and 2 is connected to a gate of the transistor 4.

Further, an input signal IN is applied to the input terminal 10, and an output signal OUT is outputted from the output terminal 12.

In the circuit described above, when the threshold voltages of the transistor 1 is denoted by VthP1, a voltage V1 which satisfies the following relationship $$VDD - VthP1 > V1 \quad (1)$$

is always applied as the input bias signal INBIAS. As a result, the bias current IB1 flows through the transistor 1. Thus, transistor 2 is saturated and thereby kept turned on at all times. The voltage VBIAS11 at the node 9 can be determined based on the resistance ratio between the transistor 1 and the transistor 2. As a result, it is possible to always keep the voltage VBIAS1 at a constant voltage.

Although the voltage VBIAS1 applied from the node 9 is supplied to the gate of the transistor 4 of the output circuit block 6, since this voltage is kept constant, the turn-on resistance of the transistor 4 is constant.

Further, when the input signal IN is applied to the input terminal 10, the change range of the input signal voltage VIN is determined as $$VDD \geq VIN \geq V1 \quad (2)$$

As a result, when the input signal voltage VIN is the voltage V1, since the transistor 3 is turned on, output current IO1 flows from VDD, so that the output signal OUT of the output terminal 12 is at the voltage VDD. On the other hand, when the input signal voltage IN is at the voltage VDD, since the transistor 3 is turned off, the output signal OUT of the output terminal 12 is at the grounded voltage GND via the transistor 4. That is, since the voltage VBIAS11 at the node 9 is kept constant, transistor 2 can function as a constant current source.

FIG. 7 is an input/output waveform diagram for explaining the operation of the above-mentioned operation, in which (A) represents the waveform of the input signal VIN, (B) represents the waveform of the voltage VBIAS1, and (C) represents the waveform of the output signal OUT, respectively.

In the semiconductor circuit device described above, referring to the output waveforms shown in FIG. 7(C), a fall delay time from VDD to GND is longer than a rise delay time from GND to VDD. In other words, since the transistor 4 of the output circuit block 6 is always turned on, when VDD is outputted, the current capability of the transistor 4 exceeds that of the transistor 3 because the transistor 3 is turned on, so that the output signal OUT can reach the voltage VDD at a high speed. In contrast, when the output signal OUT falls, since the transistor 3 is turned off, a load capacitance on the side of the output terminal 12 is discharged through the transistor 4 having a relatively large turn-on resistance, so that the delay time of the output signal OUT to GND increases.

In summary, in the known semiconductor circuit device, the circuit delay time is relatively long.

In addition, FIG. 8 shows the current consumptions of both the bias circuit block 5 and the output circuit block 6, in which (A) represents the bias current IB1 supplied from VDD and (B) represents the output current IO1 flowing through the transistor 3.

As shown in FIG. 8, in the bias circuit block 5, since both transistors 1 and 2 are turned on, the bias current IB1 is always kept constant, irrespective of the input signal IN. In contrast, since the voltage VBIAS1 at the node 9 is always kept constant, transistor 4 is kept turned on at all times so as to function as a constant current source, so that the current flowing therethrough is constant. In contrast, transistor 3 is turned on or off according to the input signal IN. That is, when the input signal IN is at the voltage VDD, since the transistor 3 is turned off, no through current flows through the output circuit block 6. However, when the input signal IN is at the voltage V1, since the transistor 3 is turned on, the output current IO1 flows through the output circuit block 6.

In summary, in the prior art semiconductor circuit device, the power consumption is undesirably large due to the through current flowing through the transistors 3.

SUMMARY OF THE INVENTION

To solve the above problems, it is an object of the present invention to provide a semiconductor circuit device which reduces the entire current consumption by. Suppressing both the current consumptions of the bias circuit and the ratio circuit, and further reduces the delay time of the output signal relative to the input signal.

To achieve the above-mentioned object, the present invention provides a semiconductor circuit device, comprising: a first transistor with a first end thereof connected to a first power source and a gate of said first transistor being connected to a bias input terminal to which a constant voltage is applied; a second transistor connected to a second end of said first transistor; a third transistor connected to said second transistor and a second power source; a fourth-transistor with a first end connected to the first power source and a gate thereof connected to an input signal terminal; and a fifth transistor connected between a second end of said fourth transistor and the second power source and to a gate of the fifth transistor a bias voltage is applied from the second end of said first transistor; wherein a voltage is applied from the drain of the first transistor to the gate of the fifth transistor, a switching signal is applied from the drain of the fourth transistor to the gate of the third transistor, and an output terminal connected to a second end of said fourth transistor and to a gate of said third transistor outputs an output signal.

BRIEF DESCRIPTION OF THE DRAWINGS

FIGS. 2(A)–2(C) are input/output waveform diagrams for explaining the operation of the circuit device shown in FIG. 1;

FIGS. 3(A)–3(C) are current consumption waveform diagrams for explaining the operation of the circuit device shown in FIG. 1;

FIGS. 7(A)–7(C) are input/output waveform diagrams for explaining the operation of the circuit device shown in FIG. 6;

FIGS. 9(A)–9(C) are voltage wave form to explain the operation of the circuit shown in FIG. 4;

DETAILED DESCRIPTION OF THE PREFERRED EMBODIMENTS

The embodiments of the semiconductor circuit device according to the present invention will be described hereinbelow with reference to the attached drawings.

1st Embodiment

Figure 1:
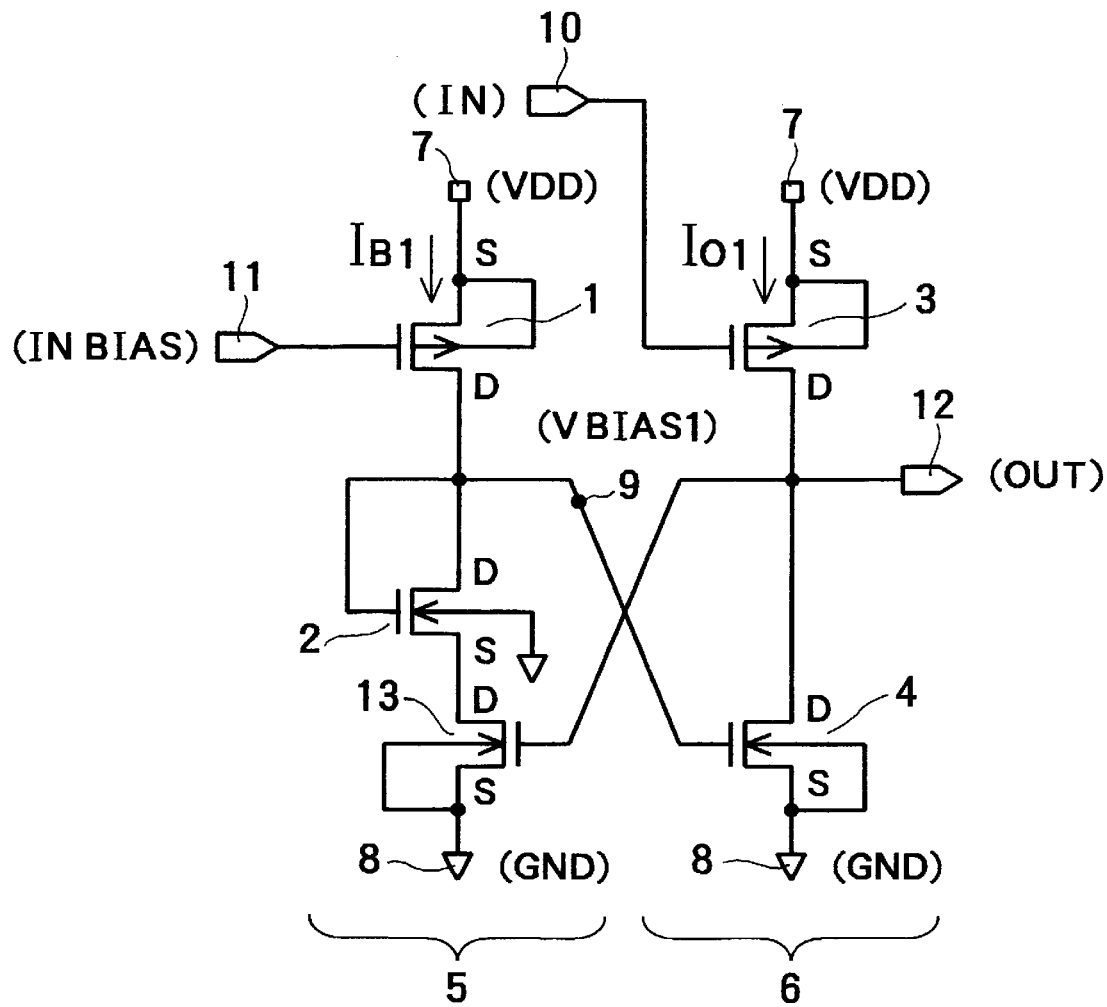
FIG. 1 is a circuit diagram showing a first embodiment of the semiconductor circuit device according to the present invention.

FIG. 1 is a circuit diagram showing the first embodiment of the semiconductor circuit device according to the present invention.

In FIG. 1, a drain of an N-channel transistor 13 is connected to the source of the transistor 2, and a source of the same transistor 13 is connected to the low potential power source GND. In addition, a gate of the transistor 13 is connected to the two common-connected drains of the two transistors 3 and 4. Here, the transistor 13 can function as a switching transistor. The circuit construction of the other elements is similar to FIG. 6, so that any detailed description thereof is omitted herein, by retaining the same reference numerals to the similar parts or elements of the circuit devices.

Referring now to FIG. 2, FIG. 2 is an input/output waveform diagram, in which (A) represents the waveform of the input signal VIN, (B) represents the waveform of the voltage VBIAS1, and (C) represents the waveform of the output signal OUT.

Here, a voltage V1 is applied to the bias input terminal 11 as the input bias INBIAS and further the input signal voltage VIN within a range as described by formula (2) is applied to the input terminal 10 as the input signal IN.

When voltage V1 is applied to the output terminal 12 as the input bias INBIAS and thereby the two transistors 2 and 13 are both turned on, since the bias current IB1 flows through the transistor 1, a voltage V1 develops at the node 9 as the bias voltage VBIAS1 on the basis of the gm ratio of the three transistors 1, 2 and 13.

This voltage VBIAS1 is applied to the gate of the transistor 4, so that the transistor 4 is allowed to function as a constant current source.

When the voltage VIN of the input signal IN applied to the input terminal 10 is denoted by V1, since the transistor 3 is turned on, the output current IO1 flows therethrough, so that the output signal OUT of the output terminal 12 is at voltage VDD. Further, since this voltage VDD is applied to the gate of the transistor 13, the transistor 13 is turned on, so that the bias current IB1 flowing through the transistor 1 flows through the transistors 2 and 13. As a result, voltage VBIAS1 develops at node 9, so that the transistor 4 is driven as a constant current source.

Under these conditions, the assumption is made that the input signal voltage VIN of the input signal IN applied to the input terminal 10 changes from the voltage V1 to the voltage VDD.

In this case, first transistor 3 is turned off. As a result, the output signal OUT of the output terminal 12 is pulled to GND by the constant current of the transistor 4. As a result, the turn-on resistance of the transistor 13 increases, so that the voltage VBIAS1 rises at the node 9. The current IDS of the transistor 4 decreases due to a rise of this potential, so that the output signal OUT is further driven to the ground voltage GND. Here, since the turn-on resistance of the transistor 13 increases with decreasing voltage of the output terminal 12 toward the ground level GND, the voltage at the node 9 increases toward the voltage VDD. Therefore, since the turn-on resistance of transistor 4 decreases, the voltage level of the output signal OUT at the output terminal 12 is pulled towards the ground voltage GND quickly, so that the transistor 13, is sufficiently turned off and in addition transistor 4 is stabilized in a state where it is sufficiently turned on.

Owing to the operation loop as described above, the transition delay time from the VDD level to the GND level at the output terminal 12 is reduced as compared with prior art circuit devices.

Under these conditions, since transistor 13 is turned off sufficiently, no current flows through transistor 1, so that it is possible to eliminate the current consumption of the bias circuit block 5 to roughly zero.

Figure 6:
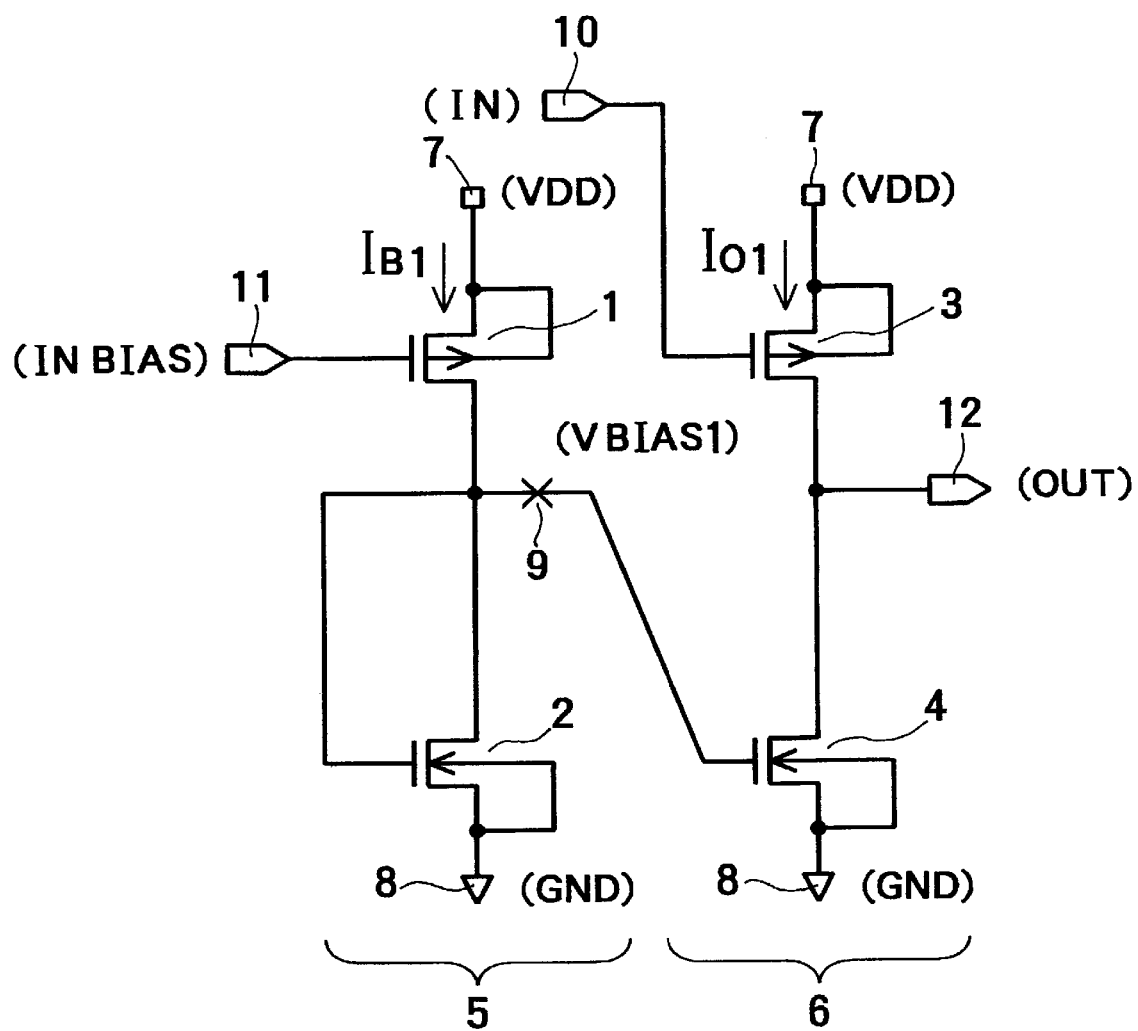
FIG. 6 is a circuit diagram showing a prior art semiconductor circuit device.

As an illustration of the differences in the circuit operation of FIGS. 1 and 6, upon comparing the waveforms of FIG. 2 with the waveforms of FIG. 7, it can be seen that the fade-out time of output signal is about 30 ns with the circuit of FIG. 6 but only 14 ns with the circuit shown in FIG. 1. So, the fade-out time is decreased by using the circuit shown in FIG. 1.

FIG. 3 shows the current consumption of both the bias circuit block 5 and the output circuit block 6 in this state, in which (A) represents the bias current IB1 supplied from the voltage VDD to the bias circuit block 5, (B) represents the output current IO1 flowing through the transistor 3, and (C) represents the waveform of the output signal OUT.

Further, when the voltage VIN of the input signal IN applied to the input terminal 10 is changed from the voltage VDD to the voltage V1, transistor 3 is turned on, so that the output current IO1 begins to flow. At this time point, since transistor 13 is turned off, although the voltage VBIAS1 at the node 9 is roughly at the voltage VDD, the voltage of the output terminal 12 begins to rise toward the voltage VDD on the basis of the gm ratio-of the two transistors 3 and 4. Further, at the initial stage, although the current of the transistor 3 flows momentarily from the transistor 3 to the transistor 4 as a through current, since the voltage of the output signal OUT at the output terminal 12 rises immediately, transistor 13 is turned on, so that the turn-on resistance of the transistor 13 decreases abruptly. As a result, the bias current IB1 begins to flow from the transistor 1 to the transistors 2 and 13, so that the voltage VBIAS1 at the node 9 decreases, and thereby the driving capability of the transistor 4 drops abruptly. As a result, the output signal OUT of the output terminal 12 is stabilized at the voltage VDD.

As described above, when the voltage level of the input signal IN applied to the input terminal 10 changes from the voltage V1 to the voltage VDD, although transistor 3 is turned off and thereby the voltage level of the output terminal 12 is pulled towards the voltage GND by the transistor 4, since the transistor 13 having the gate to which the voltage level of the output terminal 12 is applied is turned off at the same time, the voltage VBIAS1 at the node 9 is pulled up to the voltage VDD. Therefore, since the driving capability of the transistor 4 increases, the load capacitance of the output terminal 12 is discharged through the transistor 4 whose driving capability is increased, with the result that it is possible to shorten the delay time at the time when the voltage at the output terminal 12 falls from the voltage VDD to the voltage GND.

Further, when the transistor 13 is being turned off, since no through current flows from the transistor 1 to the transistor 2, it is possible to reduce the current consumption of the entire circuit device.

Figure 8A:
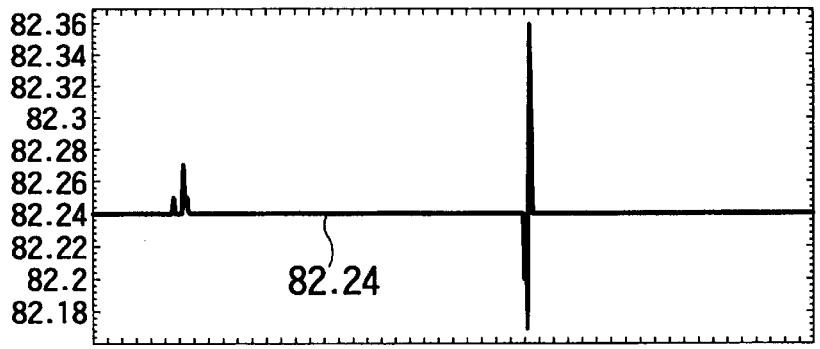
FIGS. 8(A)–8(C) are current consumption waveform diagrams for explaining the operation of the circuit device shown in FIG. 6.
Figure 8B:
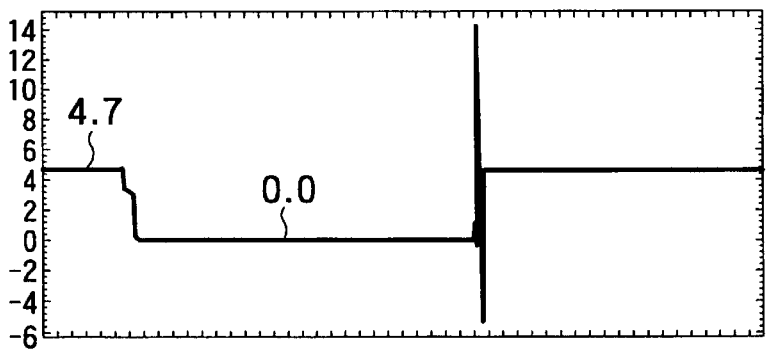
Figure 8C:
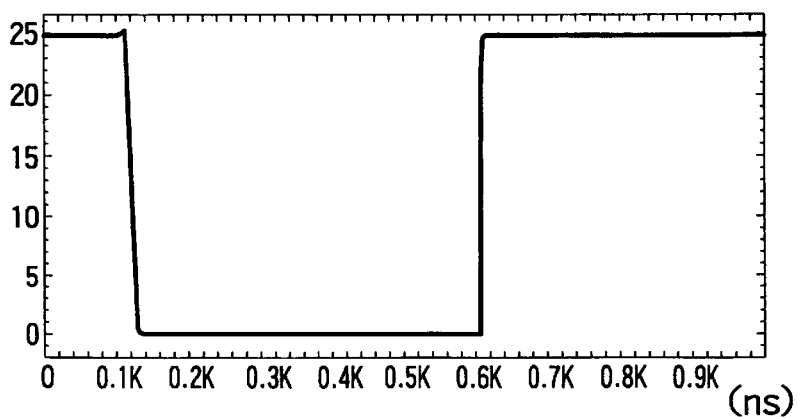

For example, upon comparing the FIG. 3 with FIG. 8, it can be seen that the power consumption is reduced by using the circuit of present invention. The Ratio Circuit is configured by the one pair of bias circuit part and output circuit part.

Table 1 below compares the power consumption according to circuit of FIG. 1 with that of the circuit shown in FIG. 6. These values are measured with an input H/L duty ratio of 50%.

TABLE 1

| OUT | L OUTPUT | H. OUTPUT | AVERAGE OF CURRENT |
| --- | --- | --- | --- |
| FIG. 1 | 0.0 μA | 106.8 μA | 53.4 μA |
| FIG. 6 | 86.9 μA | 82.2 μA | 84.6 μA |

2nd Embodiment

Figure 4:
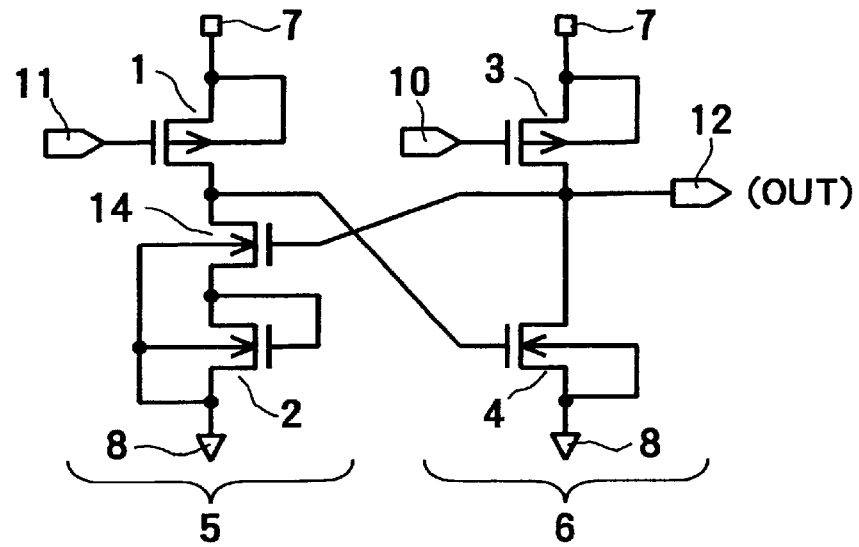
FIG. 4 is a circuit diagram showing a second embodiment of the semiconductor circuit device according to the present invention.

FIG. 4 is a circuit diagram showing the second embodiment of the semiconductor circuit device according to the present invention.

The circuit shown in FIG. 4 is different from that shown in FIG. 1 in that an n-channel switching transistor 14 is connected between the two transistors 1 and 2. In this embodiment, the basic operation thereof is basically the same as that of the circuit construction shown in FIG. 1.

The different points between the circuit shown in FIGS. 1 and 4 are: (1) drain of the transistor 1 is connected to the drain of transistor 14 (the gate of this transistor receives output signal 12); (2) another drain of transistor 14 is connected to the gate and drain of transistor 2; and, (3) the source of transistor 2 is connected to the ground level.

Referring to FIG. 9, (A) is a wave form of input signal VIN, (B) is a wave form of VBIAS1 Voltage, and (C) is a wave form of output signal OUT.

Figure 10A:
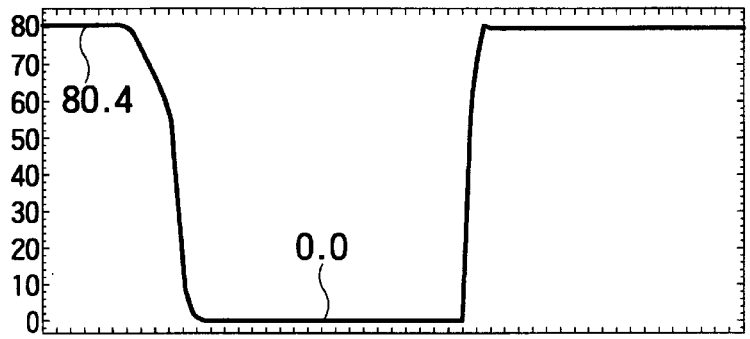
FIGS. 10(A)–10(C) are current wave form to explain the operation of the circuit shown in FIG. 4.
Figure 10B:
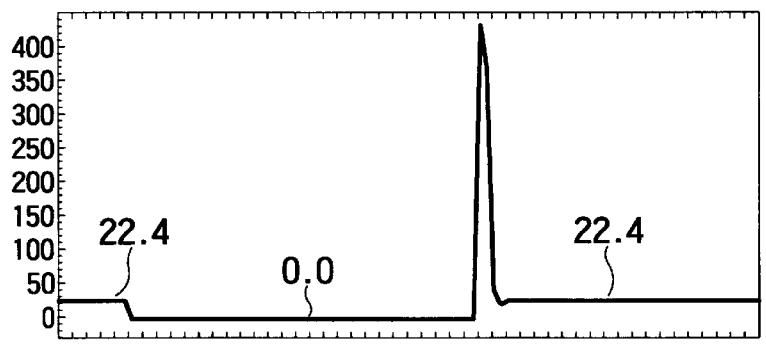
Figure 10C:
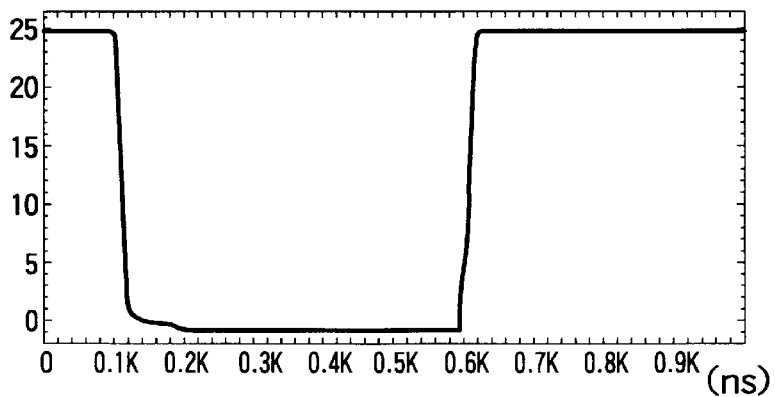

FIG. 10 shows the current consumption of both the bias circuit block 5 and the output circuit block 6 in this state, in which (A) represents the bias current IB1 supplied from the voltage VDD to the bias circuit block 5, (B) represents the output current IO1 flowing through the transistor 3, and (C) represents the waveform of the output signal OUT.

As in FIG. 1, bias input 11 is provided V1 as Input bias (In bias), input 10 is provided VIN as input signal IN, (this input signal IN changes in the range as per formula (2)). When output 12 receives V1 as input bias INBIAS, assuming that both transistors 2 and 14 have an ON-status, bias current IB1 flows through transistor 1 and voltage V1 appears as VBIAS at node 9 due to the gm-ratio of transistors 1, 2, and 14.

This voltage (VBIAS1) is input to the gate of transistor 4 and transistor 4 is used as a constant current source.

If V1 equals the input voltage V1 (which is provided to input 10), transistor 3 will have an ON-status, output current 101 will flow, and output signal (OUT) of output 12 will be at Vpp level. This Vpp is input to the gate of transistor 14. Thus, transistor 14 is ON, bias current IB1 which flows through transistor 1, flows through transistor 4 and 14. At node 9, voltage VBIAS1 appears, thus transistor 4 acts as a constant current source.

Next, input voltage IN (at input 10) is changed from V1 to Vpp. At first transistor 3 will be off. Thus, output 12 is pulled towards GND level by the constant current of transistor 4. The ON resistance of transistor 14 is increased. The gate voltage of transistor 2 (which depends on the gm ratio of transistors 1, 2, and 14) will increase the ON-resistance value of transistor 2 with increasing ON-resistance of transistor 14. As a result, node 9 of VBIAS1 increases. By this voltage increase, IPs of transistor 4 decreases and output signal out will be decreased toward GND level. As voltage of output 12 is close to GND level, ON resistance of transistors 2 and 14 increases and output value of output is pulled towards GND level rapidly. Finally, transistor 14 is turned OFF and also, transistor 4 turns ON and thus both transistors 4 and 14 become stable.

3rd Embodiment

Figure 5:
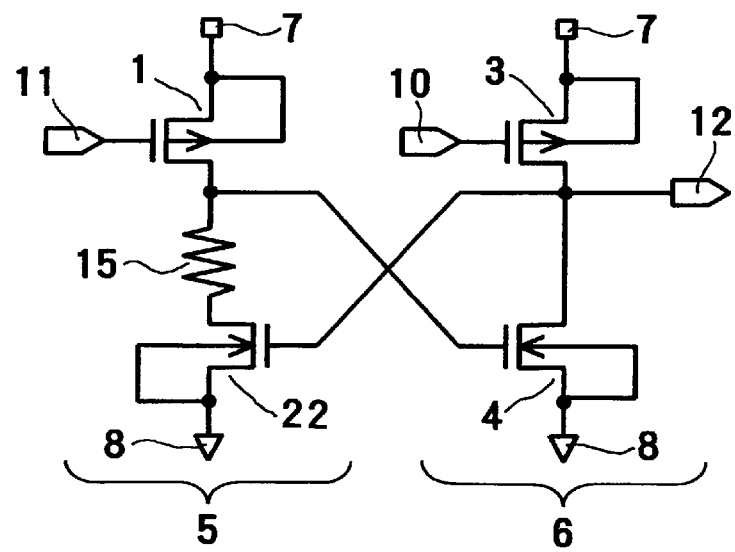
FIG. 5 is a circuit diagram showing a third embodiment of the semiconductor circuit device according to the present invention;.

FIG. 5 is a circuit diagram showing the third embodiment of the semiconductor circuit device according to the present invention.

The circuit construction shown in FIG. 5 is different from that shown in FIG. 4 in that the transistor 14 is replaced with a resistor 15. In this embodiment, the basic operation thereof is basically the same as that of the circuit shown in FIG. 1.

Figure 11:
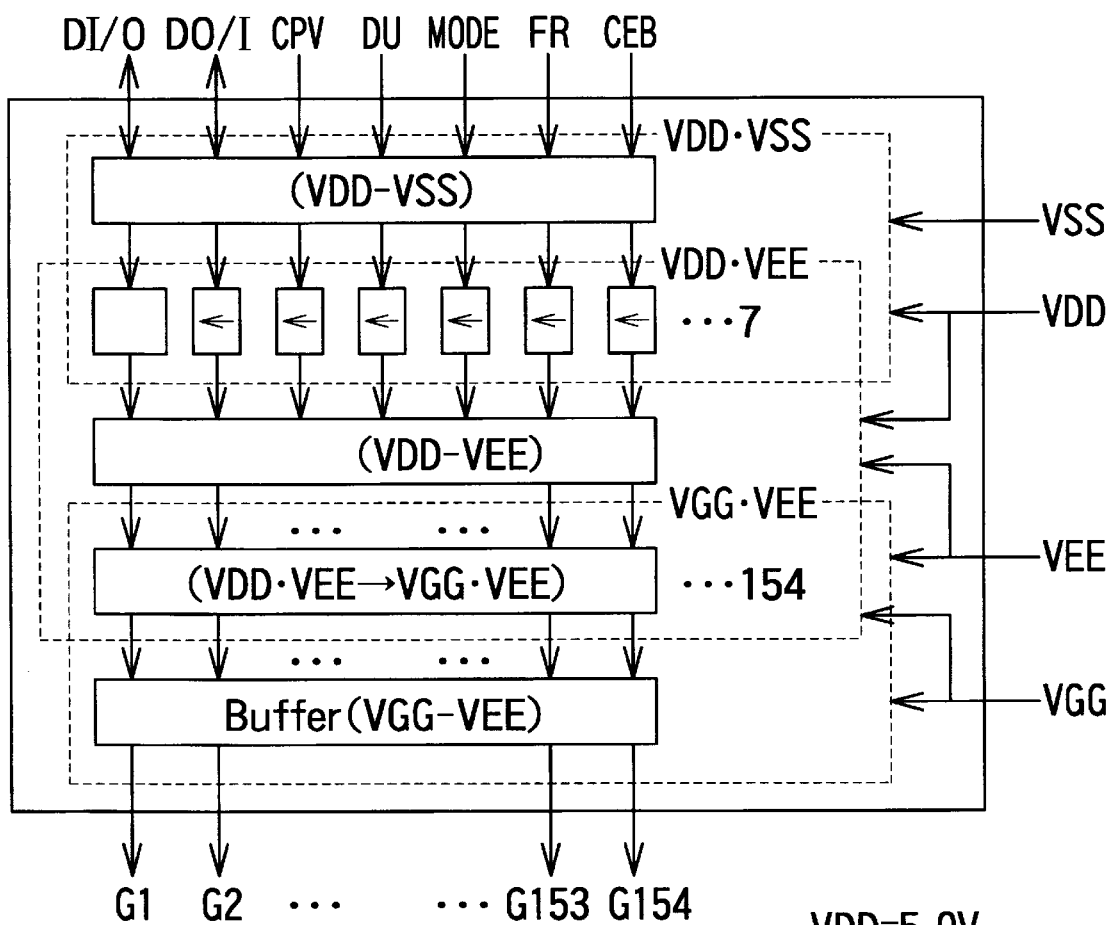
FIG. 11 is a block diagram of a LCP Driver which includes the High Speed Shift circuit according to the first, second, and third embodiments of the present invention.

To illustrate an application of the high speed level shift circuit, according to the first, second, and third embodiments of the invention, a block diagram of a LCP-Y driver is shown in FIG. 11. The Y-driver is configured by 5 blocks.

(1) Input circuit receiving signals from outside, i.e. clock signals.
(2) Shift register/control circuit transporting the signals from the input circuit.
(3) Output buffer which output the data from shift register/control circuit.
(4) Ratio circuit transporting the data between input circuit and shift register/control circuit.
(5) Level shifter transporting the data between shift register/control circuit and output buffer.

As described above, in each embodiment of the semiconductor circuit device according to the present invention, when the output of the ratio circuit is at the ground voltage GND, since the through current of the bias circuit for constructing the ratio circuit is cut off by the switching transistor, it is possible to suppress the current consumption of the entire ratio circuit. For instance, the ratio circuit is applied to a signal of ½ duty ratio, the current consumption can be reduced by about 50%. This reduction rate can be further increased with increasing duration of the GND output.

Further, it is possible to shorten the transition time from the voltage VDD to the voltage GND, as compared to prior art ratio circuit, so that the difference in delay time between when the output signal rises and when it falls is reduced.

Furthermore, in the semiconductor circuit device according to the present invention, although the circuit chip size of the ratio circuit itself slightly increases, since the delay time of the output signal is reduced, it is possible to reduce the dimensions of the next-stage buffer circuit, so that the chip size can be reduced.

Also, in the above-described embodiments, although a P-channel transistor is used as the actual switching transistor, it is of course possible to use an N-channel transistor as the switching transistor. In this case, since the delay time at a time when the output signal changes from the voltage GND to the voltage VDD can be shortened, the current consumption can be reduced, when the output signal VDD is being outputted.

As described above, in the semiconductor circuit device according to the present invention, since the bias voltage of the bias circuit is changed according to the state of the final output voltage level in such a way as to control the driving capability of the output circuit, it is possible to reduce the difference in delay time between when the output voltage rises and when falls and in addition to decrease the current consumption of the circuit device at the same time.

What is claimed is:

1. A semiconductor circuit, comprising:
   a first transistor with a first end thereof connected to a first power source and a gate of said first transistor being connected to a bias input terminal to which a constant voltage is applied;
   a second transistor connected to a second end of said first transistor;
   a third transistor connected to said second transistor and a second power source;
   a fourth transistor with a first end connected to the first power source and a gate thereof connected to an input signal terminal; and
   a fifth transistor connected between a second end of said fourth transistor and the second power source and to a gate of the fifth transistor a bias voltage is applied from the second end of said first transistor;
   wherein a voltage is applied from the drain of the first transistor to the gate of the fifth transistor, a switching signal is applied from the drain of the fourth transistor to the gate of the third transistor, and an output terminal connected to a second end of said fourth transistor and to a gate of said third transistor outputs an output signal.

2. The semiconductor circuit of claim 1, wherein said third transistor and said second transistor are connected between the second end of said first transistor and the second power source.

3. The semiconductor circuit of claim 1, wherein in said second transistor the gate and the drain are connected to each other.

4. The semiconductor circuit of claim 1, wherein the first power source is a high potential power source; the second power source is a low potential power source; said first transistor and said fourth transistor are P-channel transistors; and said third transistor and said fifth transistor are N-channel transistors.

5. A semiconductor circuit, comprising:
   a first N-channel transistor, a second N-channel transistor, and a first P-channel transistor connected in series to each other between first and second power sources; and
   a third N-channel transistor and a second P-channel transistor connected in series to each other between the first and second power sources, and wherein:
   a source of the first N-channel transistor is connected to the first power source; a drain of the first N-channel transistor is connected to a source of the second N-channel transistor; a drain of the second N-channel transistor is connected to a drain of the first P-channel transistor; and a source of the first P-channel transistor is connected to the second power source;
   a drain of the first P-channel transistor is connected to a gate of the second N-channel transistor and a gate of the third N-channel transistor, and a source of the third N-channel transistor is connected to the first power source;
   a drain of the third N-channel transistor is connected to a gate of the first N-channel transistor and a drain of the second P-channel transistor, and a source of the second P-channel transistor is connected to the second power source; and
   a first input signal is applied to the gate of the first P-channel transistor, and a second input signal is applied to the gate of the second P-channel transistor.

6. A semiconductor circuit, comprising:
   a first N-channel transistor, a second N-channel transistor, and a first P-channel transistor connected in series to each other between first and second power sources; and
   a third N-channel transistor and a second P-channel transistor connected in series to each other between the first and second power sources, and wherein:

a source of the first N-channel transistor is connected to the first power source; a drain of the first N-channel transistor is connected to a source of the second N-channel transistor; a drain of the second N-channel transistor is connected to a drain of the first P-channel transistor; and a source of the first P-channel transistor is connected to the second power source;

a drain of the third N-channel transistor is inputted to the gate of the second N-channel transistor, and a source of the third N-channel transistor is connected to the first power source;

the drain of the third N-channel transistor is connected to a gate of the first N-channel transistor, the drain of the first N-channel transistor is inputted to the gate of the first N-channel transistor and a source of the second P-channel transistor is connected to the second power source; and a first input signal is applied to the gate of the first P-channel transistor, and a second input signal is applied to the gate of the second P-channel transistor.

7. A semiconductor circuit, comprising:

a first N-channel transistor, a resistance element, and a first P-channel transistor connected in series to each other between first and second power sources; and a second N-channel transistor and a second P-channel transistor connected in series to each other between the first and second power sources, and wherein:

a source of the first N-channel transistor is connected to the first power source; a drain of the first N-channel transistor is connected to a source of the second N-channel transistor; the resistance element is connected to a drain of the first P-channel transistor; and a source of the first P-channel transistor is connected to the second power source;

a drain of the second N-channel transistor is inputted to the resistance element, and a source of the second N-channel transistor is connected to the first power source;

a drain of the second N-channel transistor is connected to a gate of the first N-channel transistor, the drain of the first N-channel transistor is inputted to the gate of the second N-channel transistor and a source of the second P-channel transistor is connected to the second power source; and a first input signal is applied to the gate of the first P-channel transistor, and a second input signal is applied to the gate of the second P-channel transistor.

* * * * *